PREPARATION OF SEMICONDUCTOR SURFACES

Filed Sept. 26, 1967

INVENTOR
D. R. OSWALD
BY George S. Indig
ATTORNEY

United States Patent Office 3,527,028
Patented Sept. 8, 1970

3,527,028

PREPARATION OF SEMICONDUCTOR SURFACES

Donald R. Oswald, Schnecksville, Pa., assignor to Bell Telephone Laboratories, Incorporated, Murray Hill and Berkeley Heights, N.J., a corporation of New York Filed Sept. 26, 1967, Ser. No. 670,714
Int. Cl. B24b *1/00*
U.S. Cl. 51—281 3 Claims

ABSTRACT OF THE DISCLOSURE

Although neither silica sol polishes nor peroxide-containing etchants alone can provide suitably pit-free surfaces on germanium, lead telluride and zinc telluride semiconductors, it has been found that silica sols containing at least 0.2% concentrated hydrogen peroxide can produce such surfaces reliably and at very good etch rates. The semiconductor surfaces obtained are sufficiently imperfection-free to be acceptable for use in the manufacture of small dimension planar semiconductor devices.

This invention relates to the making of very high quality surfaces of certain semiconductor materials by polishing with a hydrogen peroxide-silica sol medium.

BACKGROUND OF THE INVENTION

It has always been found necessary to employ some manner of surface treatment in the fabrication of devices from semiconductor materials. The conditions used in treating semiconductor surfaces obviously depend on at least the nature of the surface sought and the type of semiconductor material employed. Consequently, no "universal" surface treatment has ever been developed, and indeed it is virtually axiomatic that each new surface requirement ushers in a need for a new treatment as well.

Today's integrated circuit technology requires near imperfection-free surfaces down to dimensions of one micron or less, and sustantial difficulty in the fabrication of these circuits is encountered when the surface contains imperfections such as hillocks or depressions, or "orange peel" characteristics. Germanium, in particular, and other semiconductors as well, such as lead and zinc telluride, are materials on which it is difficult to provide the necessary imperfection-free surfaces. Past treatments have used polishing or etching with, for example, silica sol polishers or Superoxol etchant ($H_2O_2$—HF). Although these treatments singly can be used to impart certain qualities to the surface for some purposes, such as the rough matte finish given germanium by a Superoxol etch for point contact devices, they have been found not to suffice where imperfection-free surfaces down to dimensions of one micron or less are required.

SUMMARY OF THE INVENTION

In accordance with the present invention, a method has been found for preparing sufficiently imperfection-free surfaces on germanium, lead telluride and zinc telluride, which surfaces provide the essential characteristics needed in the fabrication of planar electronic devices. The invention relies on the unexpectedly good surfaces obtained by the combination of a hydrogen peroxide oxidant and a silica sol polishing medium, for example (an $SiO_2$ suspension in an aquous hydroxide solution with a pH∼9–10) and in particular on the use of a silica sol having at least 0.2% (by volume) of a 30% (by volume) aqueous hydrogen peroxide as an added constituent.

DESCRIPTION OF THE DRAWING

The invention will be further described and particularized in the following detailed description in conjunction with the accompanying drawing in which.

DETAILED DESCRIPTION

Figure 3:
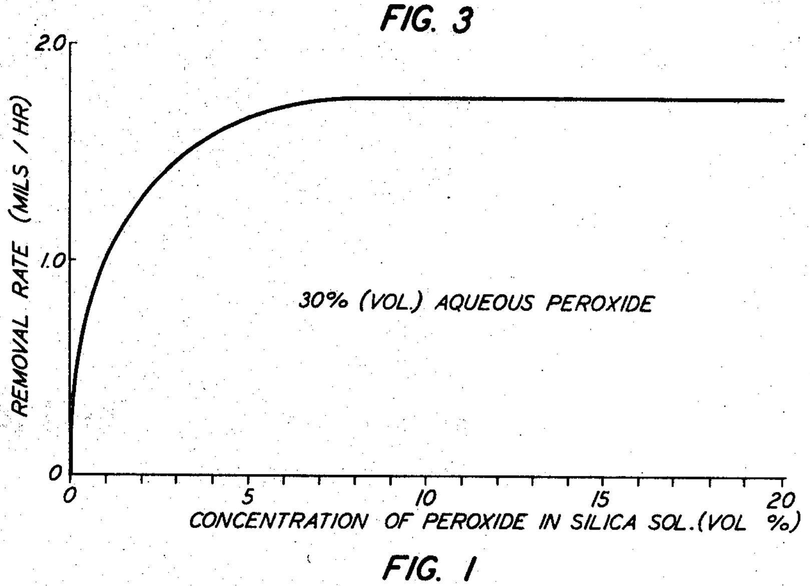
FIG. 3 is a graph of removal rate (mil/hr.) vs. peroxide concentration (volume percent).

The silica sols referred to are generally described in U.S. Pat. 3,170,273 to R. J. Walsh et al. Basically they are aqueous suspensions of $SiO_2$ particles of 10–75 millimicrons in size at a concentration of 10–40% by weight. Commercial compositions with sufficient hydroxide content for a pH of approximately 9–10 are available.

These silica sols alone have proved to be excellent polishing media for treating silicon semiconductors. However, as will be shown hereinafter, on many other semiconductors silica sols alone have not been able to provide the requisite surface characteristics needed for today's thin film electronic devices. Among these are, most importantly, germanium, and as well, lead telluride and zinc telluride.

The successful modification of the silica sol polishing agents that is the subject of this invention utilize any of the standard silica sols referred to above in combination with an oxidant of hydrogen peroxide. This peroxide-modified silica sol typically has at least 0.2% (vol.) of a 30% (vol.) aqueous hydrogen peroxide solution added.

Hydrogen peroxide has, for many years, been employed in the art in the etching of germanium semi-conductors. However, its prior use has been in a completely different form from that contemplated by the invention, as well as for totally different reasons and with entirely opposite results.

Past uses of hydrogen peroxide took the form of the standard Superoxol etch which typically consisted of 1 part of 30% hydrogen peroxide, 1 part 48% hydrofluoric acid, and 4 parts distilled water (all by volume). The function of its constituents was recognized to be oxidation of the semiconductor by the peroxide and its removal by the HF. There was no concurrent abrasion during the chemical etch step.

It is crucial to an understanding of the present invention that it be recognized that the Superoxol etch did not and could not provide a germanium surface with the requisite surface characteristics needed for planar device construction, viz, a mirror-like (specular), imperfection-free, flat surface, without "orange peel" characteristics. Rather, it was the purpose and intent that it provide a dull (matte), roughened surface needed for the making of an entirely different kind of semiconductor device, one which employed pressure-point contacts to the surface. In the words of a standard treatise on transistor technology, "Transistor Technology," vol. I, edited by H. E. Bridgers, J. H. Scaff and J. N. Shive, D. Van Nostrand (1958) at page 354:

[A Superoxol] treatment leaves the germanium surface *etch-pitted and roughened to a matte finish, which is mechanically desirable* in pressure-point contact devices where some surface roughness helps to anchor the contact points against lateral sliding. (Emphasis added.)

It is stressed that this prior art method does not employ concurrent abrasion, does utilize a strong etchant, HF, and does seek a rough surface for the semiconductor, all of which factors are at variance with the inventive method and make the present discovery entirely unexpected.

The part played by the peroxide in the inventive modified silica sol is unexplained and completely unpredicted. Assuming that the peroxide functions merely as an oxidant in the inventive treatment, as it seems to in the Superoxol system, it is not known how this can account for the *improvement* in the surface obtained over that achieved by an unmodified silica sol or by Superoxol etchant; indeed, in the absence of peroxide, perhaps silica sol is capable of providing a surface suitable for certain purposes not of concern to the present invention. But, inexplicably, it is the presence of peroxide in the silica sol which improves not just the rate of removal of material, but the *characteristics of the surface exposed*. This, of course, is the essence of the invention.

Moreover, the improvement of the invention is achieved even with slight quantities of 30% peroxide, as little as tenths of a percent (vol.), whereas the well-known Superoxol etch employed relatively vast quantities, one part 30% peroxide in six, or 16% (vol.).

The surprising improvement in the surfaces treated with the inventive peroxide-modified silica sol is amply demonstrated by the following comparative test between an unmodified and a peroxide-modified silica sol treatment on germanium.

Polishing procedure

A diamond saw with an I.D. edge was used to cut a 0.012" thick slice from a germanium ingot. Both sides of the slice were lapped with a 14$\mu$ particle size garnet abrasive slurry, resulting in the removal of .002" from each side. This was followed by an etch (2 parts (vol.) 48% HF, 2 parts (vol.) 30% $H_2O_2$, 3 parts (vol.) $H_2O$) which uniformly removed .001" from each side simultaneously. At this point, the slice was .006" thick and ready for ultimate polishing with the silica sol polishing material.

The polishing apparatus used was a commercial lapping machine (Lap Master 12, Crane Packing Co.) with some modification. The main polishing plate (12" diameter) and the slice-holding disc (4½" diameter) which held the slice face against the polishing plate, were rotated in the same direction, the former at 60 r.p.m. and the latter at 33 r.p.m. As is usual, the slice was bonded to the disc with a water-insoluble thermoplastic cement. Typically, a single layer of boat-sail drill 100% cotton cloth or a double layer of silk was used as the sol-absorbing cover for the main polishing plate. The sol was applied at the rate of about 3 mls. per minute continuously by dripping. The slice-holding disc was held against the main polishing plate with sufficient force so the pressure on the slice was typically 4–7 p.s.i. After polishing was completed, the slice was water rinsed, swabbed with mild detergent solution and wiped dry.

Example I

Figure 1:
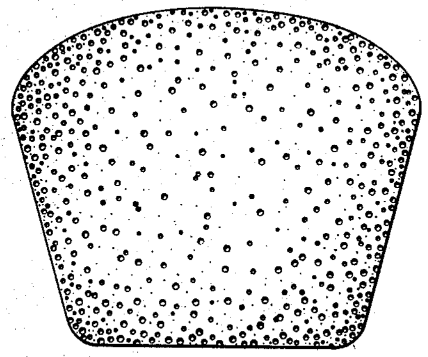
FIG. 1 is a representation of a germanium surface polished with unmodified silica sol as it appears on inspection.

In accordance with the polishing procedure just set forth, a germanium slice was prepared using an unmodified silica sol of about 30% $SiO_2$ by weight, 35–40 millimicrons particle size and a pH of 10. It was observed that only a few tenths of a mil were removed even when polishing was continued up to 6 hours. The resulting surface was not satisfactory, being pocked with numerous pits that made it unacceptable for small dimension, thin film devices. The surface obtained is shown in FIG. 1.

Example II

Figure 2:
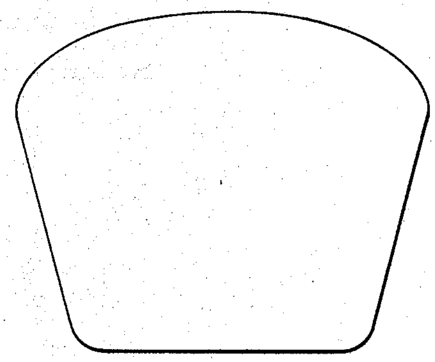
FIG. 2 is a representation of a germanium surface polished with the inventive peroxide-modified silica sol as it appears on inspection.

The identical procedure of Example I was followed except for the use of a modified silica sol of the invention which contained 2% (by vol.) of 30% (vol.) aqueous hydrogen peroxide. Unlike the previous case with unmodified silica sol, an adequate removal rate of about 1 mil per hour was obtained, and as a result polishing was continued until about .002" was removed. The surfaces obtained were featureless, with no indication of residual damage or other commonly encountered irregularities such as pitting or haze. Small-scale flatness deviations similar to "orange peel" were not detectable by profilometer measurements capable of delineating 250 A. deep irregularities. The surface obtained is shown in FIG. 2.

These spectacular results are obtainable even with very small amounts of peroxide. As a practical matter, however, less than 0.2% results in an unacceptably slow removal rate. Removal rate as a function of peroxide concentration is shown in FIG. 3, where it is seen that the maximum rate occurs at about 6%. Higher concentrations, it is seen, are also permissible but there is no added benefit either in surface quality or removal rate. Indeed, since concentrated peroxide may pose certain safety hazards, there may even be compelling reasons for not employing high concentrations.

The results reported for germanium hold true for lead and zinc telluride as well. Moreover, the composition of the semiconductor need not be free of impurities or in any way specially pre-treated. The inventive peroxide-modified silica sols have successfully polished highly doped germanium (.005 ohm-cm.) as well as substantially impurity-free germanium (40–50 ohm-cm.), and p, n and mixed p-n type semiconductors are considered within the invention.

The invention has been described with reference to particular embodiments and examples thereof, but it is intended that variations therefrom which basically rely on the teachings of the invention are to be considered as within the scope of the description and the appended claims.

I claim:

1. A method for preparing suitably pit-free surfaces on a semiconductor material consisting essentially of a composition selected from the group consisting of germanium, lead telluride and zinc telluride, comprising the step of polishing the material with a polish comprising a silica sol having present hydrogen peroxide equivalent to at least 0.2% (vol.) of 30% (vol.) aqueous hydrogen peroxide.

2. The method of claim 1 wherein the silica sol comprises an aqueous suspension of $SiO_2$ particles, 10 and 75 millimicrons in size at a concentration of 10 to 40% by weight, and sufficient hydroxide for a pH of about 9 to 10.

3. The method of claim 2 wherein the hydrogen peroxide is present in the silica sol in an amount equivalent to from 0.2 to 6% (vol.).

References Cited

UNITED STATES PATENTS 3,170,273 2/1965 Walsh et al. __________ 51—281

HAROLD D. WHITEHEAD, Primary Examiner